(12) United States Patent
Kazi et al.

(10) Patent No.: US 11,650,878 B2
(45) Date of Patent: *May 16, 2023

(54) FAILURE ABATEMENT APPROACH FOR A FAILED STORAGE UNIT

(71) Applicant: Pure Storage, Inc., Mountain View, CA (US)

(72) Inventors: Asimuddin Kazi, Naperville, IL (US); Jason K. Resch, Chicago, IL (US)

(73) Assignee: Pure Storage, Inc., Mountain View, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 17/375,723

(22) Filed: Jul. 14, 2021

(65) Prior Publication Data

US 2021/0342224 A1     Nov. 4, 2021

Related U.S. Application Data

(63) Continuation of application No. 16/708,113, filed on Dec. 9, 2019, now Pat. No. 11,093,327, which is a
(Continued)

(51) Int. Cl.
*G06F 11/07* (2006.01)
*G06F 11/10* (2006.01)
(Continued)

(52) U.S. Cl.
CPC .......... *G06F 11/1076* (2013.01); *G06F 3/064* (2013.01); *G06F 3/067* (2013.01);
(Continued)

(58) Field of Classification Search
CPC . G06F 11/008; G06F 11/1076; G06F 11/1092
(Continued)

(56) References Cited

U.S. PATENT DOCUMENTS 4,092,732 A     5/1978  Ouchi
5,454,101 A     9/1995  Mackay
(Continued)

OTHER PUBLICATIONS

Chung; An Automatic Data Segmentation Method for 3D Measured Data Points; National Taiwan University; pp. 1-8; 1998.
(Continued)

*Primary Examiner* — Chae M Ko
(74) *Attorney, Agent, or Firm* — Garlick & Markison; Timothy W. Markison; Timothy D. Taylor

(57) ABSTRACT

A method for execution by a vault management device of a storage network includes determining a failure impact level to vaults of the storage network based on a failed storage unit within the vaults, where the vaults include a first vault that is associated with a first set of storage units and a first decode threshold number, and a second vault that is associated with a second set of storage units and a second decode threshold number, and where the failure impact level is based on the number of non-failed storage units within each of the vaults. The method continues with determining a failure abatement approach based on the failure impact level. The method continues by with facilitating the failure abatement approach.

20 Claims, 8 Drawing Sheets

Related U.S. Application Data continuation-in-part of application No. 16/165,332, filed on Oct. 19, 2018, now abandoned, which is a continuation of application No. 15/357,814, filed on Nov. 21, 2016, now Pat. No. 10,114,697, which is a continuation-in-part of application No. 15/012,555, filed on Feb. 1, 2016, now Pat. No. 9,547,548, which is a continuation of application No. 13/890,438, filed on May 9, 2013, now Pat. No. 9,292,212.

(60) Provisional application No. 61/663,796, filed on Jun. 25, 2012.

(51) Int. Cl.
| | |
|---|---|
| H03M 13/00 | (2006.01) |
| H03M 13/05 | (2006.01) |
| G06F 3/06 | (2006.01) |
| H03M 13/37 | (2006.01) |
| H03M 13/15 | (2006.01) |
| G06F 11/00 | (2006.01) |
| G06F 11/20 | (2006.01) |

(52) U.S. Cl.
CPC .......... *G06F 3/0619* (2013.01); *G06F 3/0644* (2013.01); *G06F 11/1092* (2013.01); *H03M 13/05* (2013.01); *H03M 13/3761* (2013.01); *H03M 13/611* (2013.01); *G06F 11/008* (2013.01); *G06F 11/2058* (2013.01); *G06F 2211/109* (2013.01); *H03M 13/1515* (2013.01)

(58) Field of Classification Search
USPC .......................................... 714/6.2, 6.22–6.24
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers |
| 5,802,364 | A | 9/1998 | Senator |
| 5,809,285 | A | 9/1998 | Hilland |
| 5,890,156 | A | 3/1999 | Rekieta |
| 5,987,622 | A | 11/1999 | Lo Verso |
| 5,991,414 | A | 11/1999 | Garay |
| 6,012,159 | A | 1/2000 | Fischer |
| 6,058,454 | A | 5/2000 | Gerlach |
| 6,128,277 | A | 10/2000 | Bruck |
| 6,175,571 | B1 | 1/2001 | Haddock |
| 6,192,472 | B1 | 2/2001 | Garay |
| 6,256,688 | B1 | 7/2001 | Suetaka |
| 6,272,658 | B1 | 8/2001 | Steele |
| 6,301,604 | B1 | 10/2001 | Nojima |
| 6,356,949 | B1 | 3/2002 | Katsandres |
| 6,366,995 | B1 | 4/2002 | Nikolaevich |
| 6,374,336 | B1 | 4/2002 | Peters |
| 6,415,373 | B1 | 7/2002 | Peters |
| 6,418,539 | B1 | 7/2002 | Walker |
| 6,449,688 | B1 | 9/2002 | Peters |
| 6,567,948 | B2 | 5/2003 | Steele |
| 6,571,282 | B1 | 5/2003 | Bowman-Amuah |
| 6,606,718 | B1 | 8/2003 | Bessios |
| 6,609,223 | B1 | 8/2003 | Wolfgang |
| 6,697,846 | B1 | 2/2004 | Soltis |
| 6,718,361 | B1 | 4/2004 | Basani |
| 6,760,808 | B2 | 7/2004 | Peters |
| 6,785,768 | B2 | 8/2004 | Peters |
| 6,785,783 | B2 | 8/2004 | Buckland |
| 6,826,711 | B2 | 11/2004 | Moulton |
| 6,879,596 | B1 | 4/2005 | Dooply |
| 7,003,688 | B1 | 2/2006 | Pittelkow |
| 7,024,451 | B2 | 4/2006 | Jorgenson |
| 7,024,609 | B2 | 4/2006 | Wolfgang |
| 7,080,101 | B1 | 7/2006 | Watson |
| 7,103,824 | B2 | 9/2006 | Halford |
| 7,103,915 | B2 | 9/2006 | Redlich |
| 7,111,115 | B2 | 9/2006 | Peters |
| 7,140,044 | B2 | 11/2006 | Redlich |
| 7,146,644 | B2 | 12/2006 | Redlich |
| 7,171,493 | B2 | 1/2007 | Shu |
| 7,222,133 | B1 | 5/2007 | Raipurkar |
| 7,240,236 | B2 | 7/2007 | Cutts |
| 7,272,613 | B2 | 9/2007 | Sim |
| 7,636,724 | B2 | 12/2009 | De La Torre |
| 8,386,841 | B1 | 2/2013 | Renade |
| 9,141,297 | B2 | 9/2015 | Resch |
| 2002/0062422 | A1 | 5/2002 | Butterworth |
| 2002/0166079 | A1 | 11/2002 | Ulrich |
| 2003/0018927 | A1 | 1/2003 | Gadir |
| 2003/0037261 | A1 | 2/2003 | Meffert |
| 2003/0065617 | A1 | 4/2003 | Watkins |
| 2003/0084020 | A1 | 5/2003 | Shu |
| 2004/0024963 | A1 | 2/2004 | Talagala |
| 2004/0122917 | A1 | 6/2004 | Menon |
| 2004/0215998 | A1 | 10/2004 | Buxton |
| 2004/0228493 | A1 | 11/2004 | Ma |
| 2005/0100022 | A1 | 5/2005 | Ramprashad |
| 2005/0114594 | A1 | 5/2005 | Corbett |
| 2005/0125593 | A1 | 6/2005 | Karpoff |
| 2005/0131993 | A1 | 6/2005 | Fatula, Jr. |
| 2005/0132070 | A1 | 6/2005 | Redlich |
| 2005/0144382 | A1 | 6/2005 | Schmisseur |
| 2005/0226325 | A1 | 10/2005 | Dei |
| 2005/0229069 | A1 | 10/2005 | Hassner |
| 2006/0047907 | A1 | 3/2006 | Shiga |
| 2006/0136448 | A1 | 6/2006 | Cialini |
| 2006/0156059 | A1 | 7/2006 | Kitamura |
| 2006/0224603 | A1 | 10/2006 | Correll, Jr. |
| 2006/0224844 | A1 | 10/2006 | Kano |
| 2007/0079081 | A1 | 4/2007 | Gladwin |
| 2007/0079082 | A1 | 4/2007 | Gladwin |
| 2007/0079083 | A1 | 4/2007 | Gladwin |
| 2007/0088970 | A1 | 4/2007 | Buxton |
| 2007/0174192 | A1 | 7/2007 | Gladwin |
| 2007/0214285 | A1 | 9/2007 | Au |
| 2007/0234110 | A1 | 10/2007 | Soran |
| 2007/0283167 | A1 | 12/2007 | Venters |
| 2009/0094251 | A1 | 4/2009 | Gladwin |
| 2009/0094318 | A1 | 4/2009 | Gladwin |
| 2009/0132755 | A1 | 5/2009 | Radke |
| 2009/0216986 | A1 | 8/2009 | Sakurai |
| 2009/0248995 | A1 | 10/2009 | Noguchi |
| 2010/0023524 | A1 | 1/2010 | Gladwin |
| 2011/0122523 | A1 | 5/2011 | Gladwin |
| 2011/0209032 | A1 | 8/2011 | Choi |
| 2011/0225386 | A1 | 9/2011 | Motwani |
| 2011/0307424 | A1 | 12/2011 | Jin |
| 2012/0084386 | A1 | 4/2012 | Fu |
| 2012/0166757 | A1 | 6/2012 | Volvovski |
| 2012/0179870 | A1 | 7/2012 | Wang |
| 2012/0226933 | A1 | 9/2012 | Baptist |
| 2013/0014254 | A1 | 1/2013 | Gladwin |
| 2013/0138706 | A1 | 5/2013 | Dhuse |
| 2013/0283095 | A1 | 10/2013 | Dhuse |
| 2013/0290482 | A1 | 10/2013 | Leggette |
| 2014/0064288 | A1 | 3/2014 | Melick |
| 2014/0068259 | A1 | 3/2014 | Resch |
| 2014/0247516 | A1 | 9/2014 | Gladwin |
| 2015/0012797 | A1 | 1/2015 | Leggette |
| 2015/0067245 | A1 | 3/2015 | Kruger |
| 2015/0193309 | A1 | 7/2015 | Khadiwala |
| 2015/0234846 | A1 | 8/2015 | Moore |
| 2017/0052843 | A1* | 2/2017 | Kazi ................... G06F 11/1068 |
| 2017/0168720 | A1* | 6/2017 | Kazi ................... G06F 11/1076 |
| 2019/0065315 | A1* | 2/2019 | Shirley, Jr .......... G06F 11/1076 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

* cited by examiner

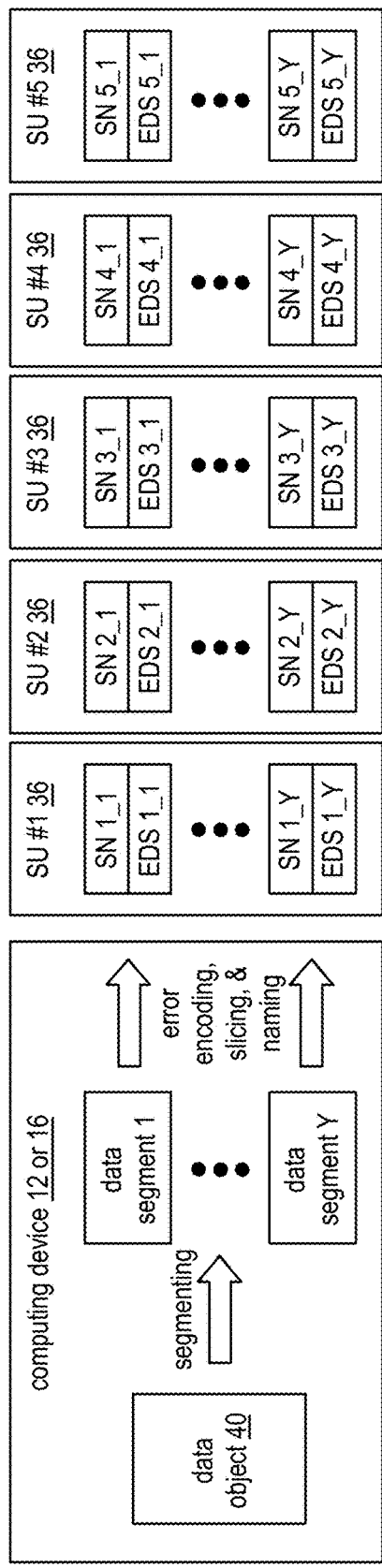
FIG. 3
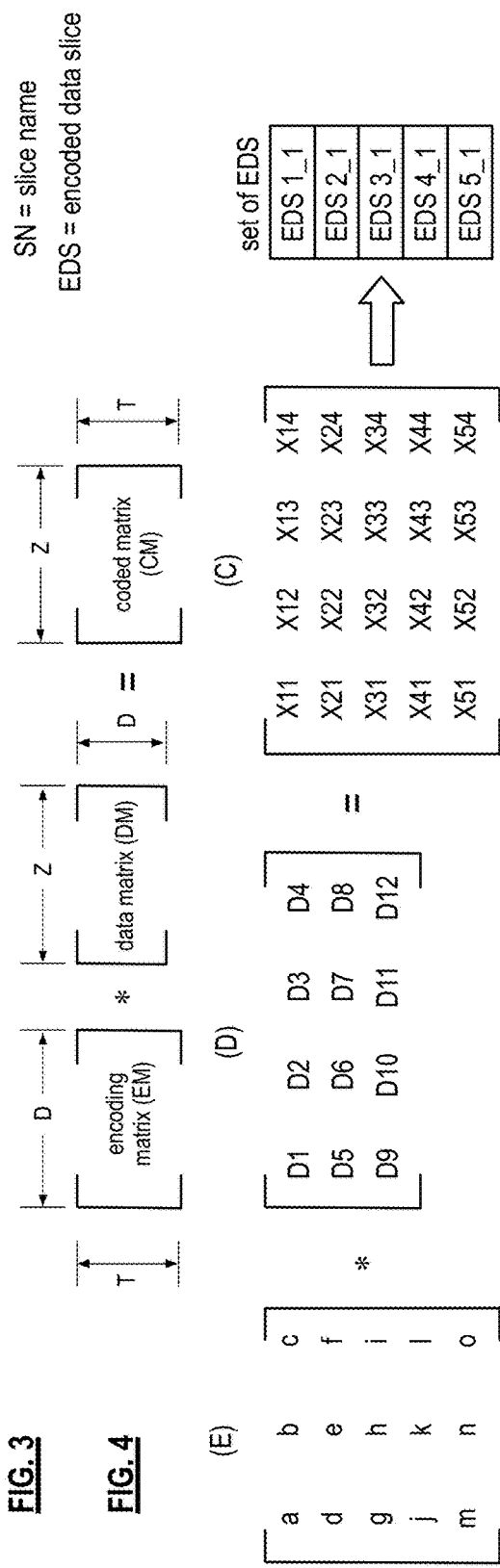
FIG. 4
FIG. 5
FIG. 6

FAILURE ABATEMENT APPROACH FOR A FAILED STORAGE UNIT

CROSS-REFERENCE TO RELATED APPLICATIONS

This application claims priority pursuant to 35 U.S.C. § 120 as a continuation of U.S. Utility application Ser. No. 16/708,113, entitled "FAILURE ABATEMENT APPROACH FOR FAILED STORAGE UNITS COMMON TO MULTIPLE VAULTS," filed Dec. 9, 2019, which is a continuation-in-part of U.S. Utility application Ser. No. 16/165,332, entitled "LARGE OBJECT PARALLEL WRITING," filed Oct. 19, 2018, now abandoned, which is a continuation of U.S. Utility application Ser. No. 15/357,814, entitled "LARGE OBJECT PARALLEL WRITING," filed Nov. 21, 2016, issued on Oct. 30, 2018 as U.S. Pat. No. 10,114,697, which is a continuation-in-part of U.S. Utility application Ser. No. 15/012,555, entitled "DETECTING STORAGE ERRORS IN A DISPERSED STORAGE NETWORK," filed Feb. 1, 2016, issued on Jan. 17, 2017 as U.S. Pat. No. 9,547,548, which is a continuation of U.S. Utility application Ser. No. 13/890,438, entitled "DETECTING STORAGE ERRORS IN A DISPERSED STORAGE NETWORK," filed May 9, 2013, issued on Mar. 22, 2016 as U.S. Pat. No. 9,292,212, which claims priority pursuant to 35 U.S.C. § 119(e) to U.S. Provisional Application No. 61/663,796, entitled "ACCESSING A DISTRIBUTED STORAGE AND TASK NETWORK," filed Jun. 25, 2012, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
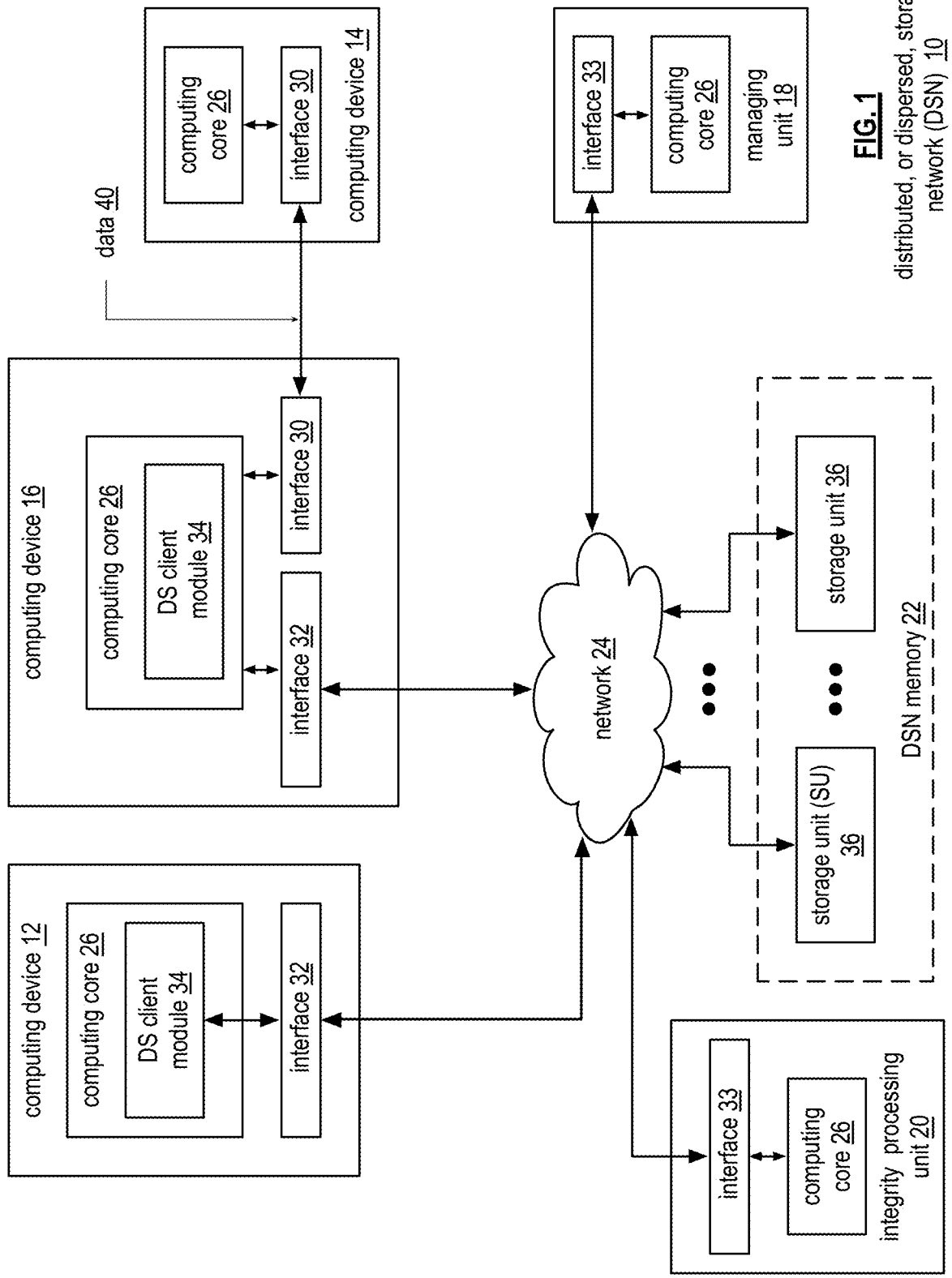
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
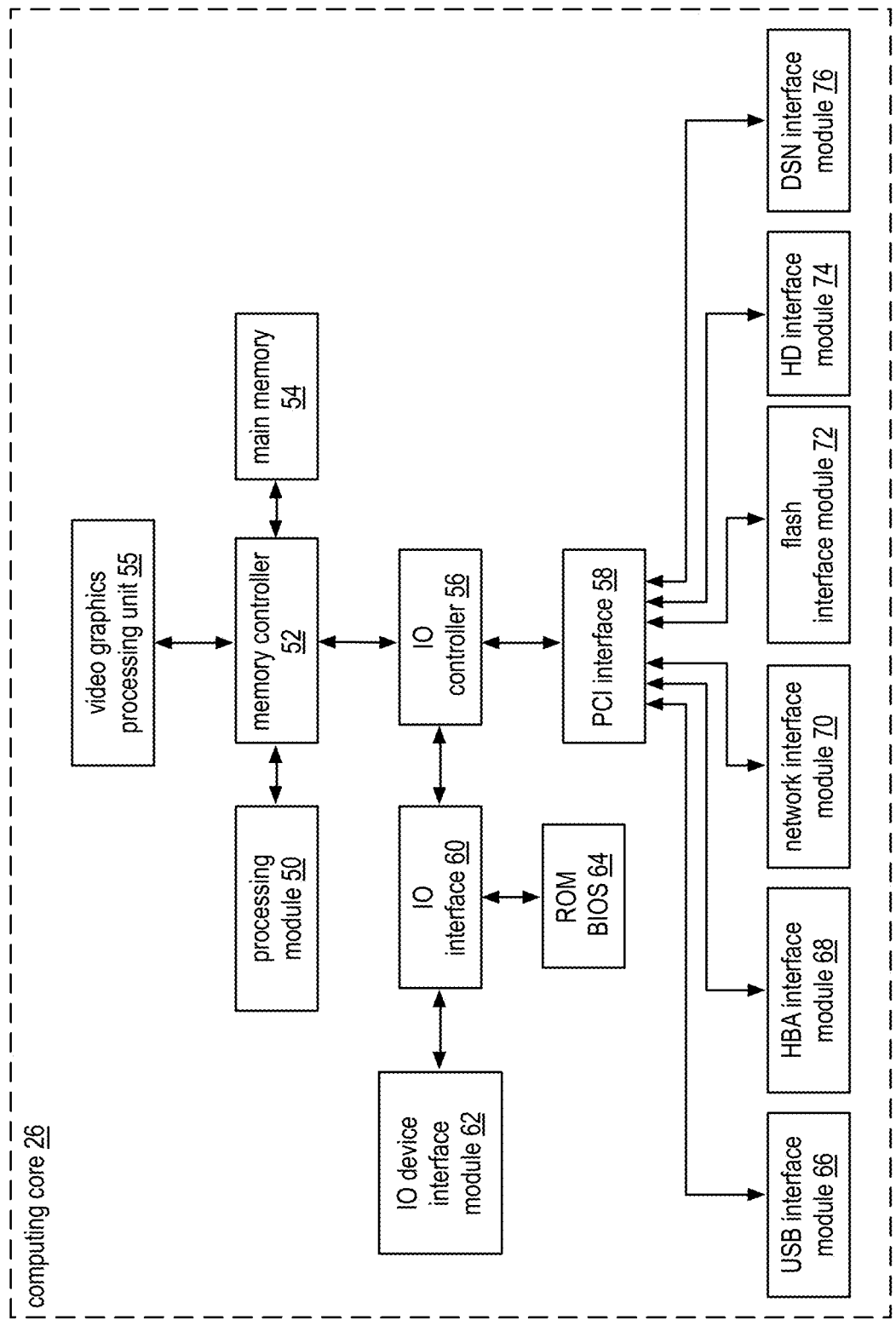
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
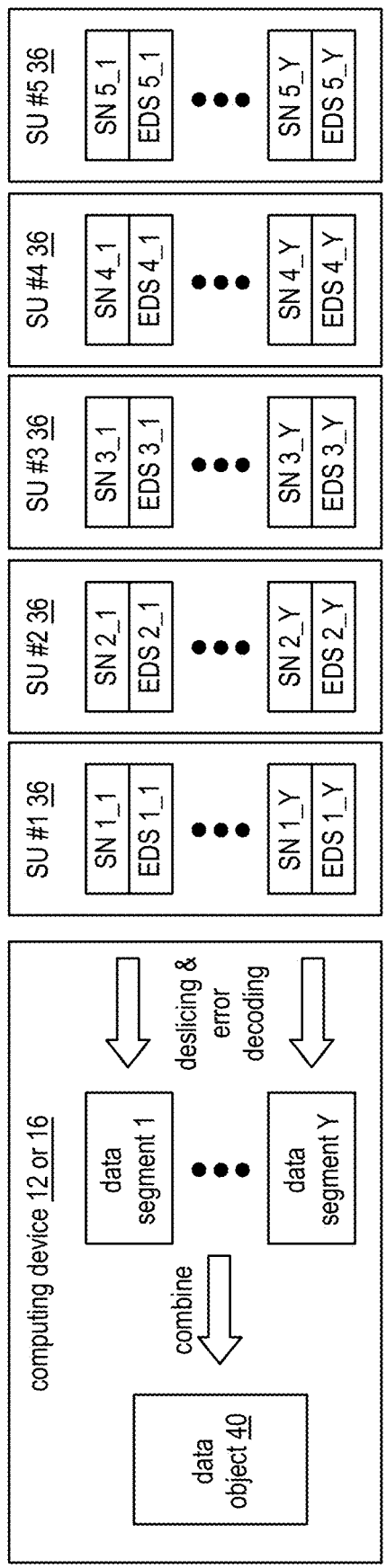
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
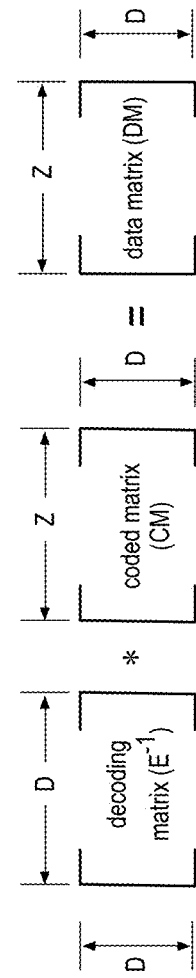
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
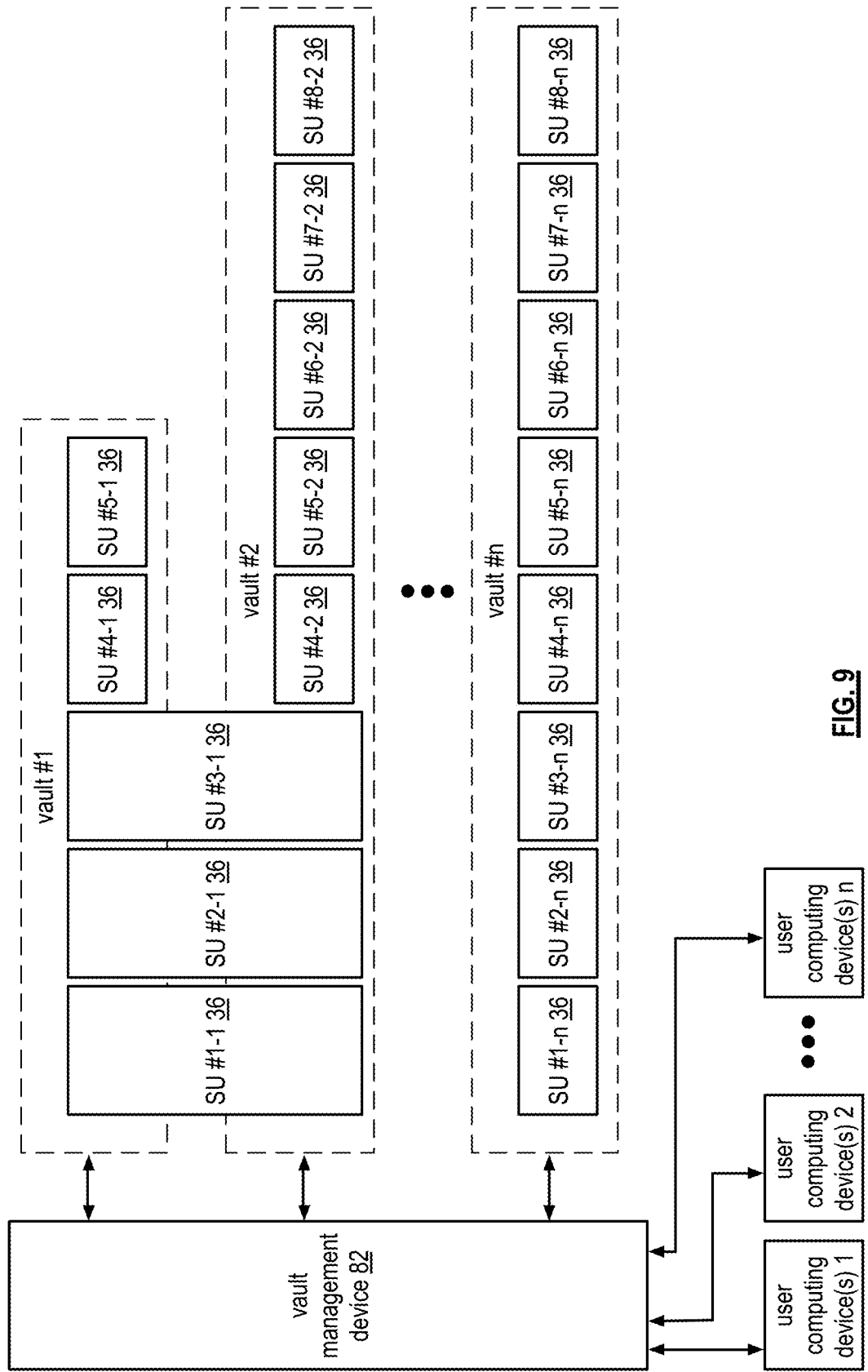
FIG. 9 is a schematic block diagram of an embodiment of multiple vault management in accordance with the present invention.

FIG. 9 is a schematic block diagram of an embodiment of multiple vault management that includes a vault management device 82, a plurality of vaults 1-n, and a plurality of user computing device(s) 1-n (e.g., computing devices 12 or 16 of FIG. 1).

The vault management device 82 may be the managing unit 18 of FIG. 1 and may be a separate computing device, may be a common computing device, and/or may be integrated into one or more of the user computing devices 1-n and/or into one or more of the storage units 36.

A vault is a virtual memory block associated with a portion of an overall namespace of a storage network (e.g., the DSN). For example, vault #1 is associated with a particular user and/or entity (e.g., user computing device(s) 1) and is supported by physical storage units (SUs) #1-1 36 through SU #5-1 36. The user computing device(s) 1 include one or more user computing devices having data access permissions to vault #1 (e.g., permissions to read, write, edit, and/or delete data, etc.). Vault #2 is associated with user computing device(s) 2 and is supported by SUs #1-1 36 through SU #3-1 36 and SUs #4-2 through SUs #8-2. Vault #n is associated with user computing device(s) n and is supported by SU #1-n 36 through SU #8-n.

Vaults may share one or more common storage units. For example, vault #1 and vault #2 share SU #1-1 36 through SU #3-1. Over time, one or more storage units 36 may degrade and/or fail. System impact is greater from a failure or degradation of a storage unit that is common to two or more vaults. The vault management device 82 is operable to determine a failure abatement approach to address degradation and failure of the one or more storage units, particularly failure of storage units that are common to two or more vaults. The failure abatement approach may include sending a failure notification to one or more user computing devices, requesting replacement of a failed storage unit, migrating slices from a degraded storage unit to a non-degraded (e.g., non-failed) storage unit, and rebuilding data slices associated with a failed storage unit for at least temporary storage in a non-failed storage unit.

Figure 10:
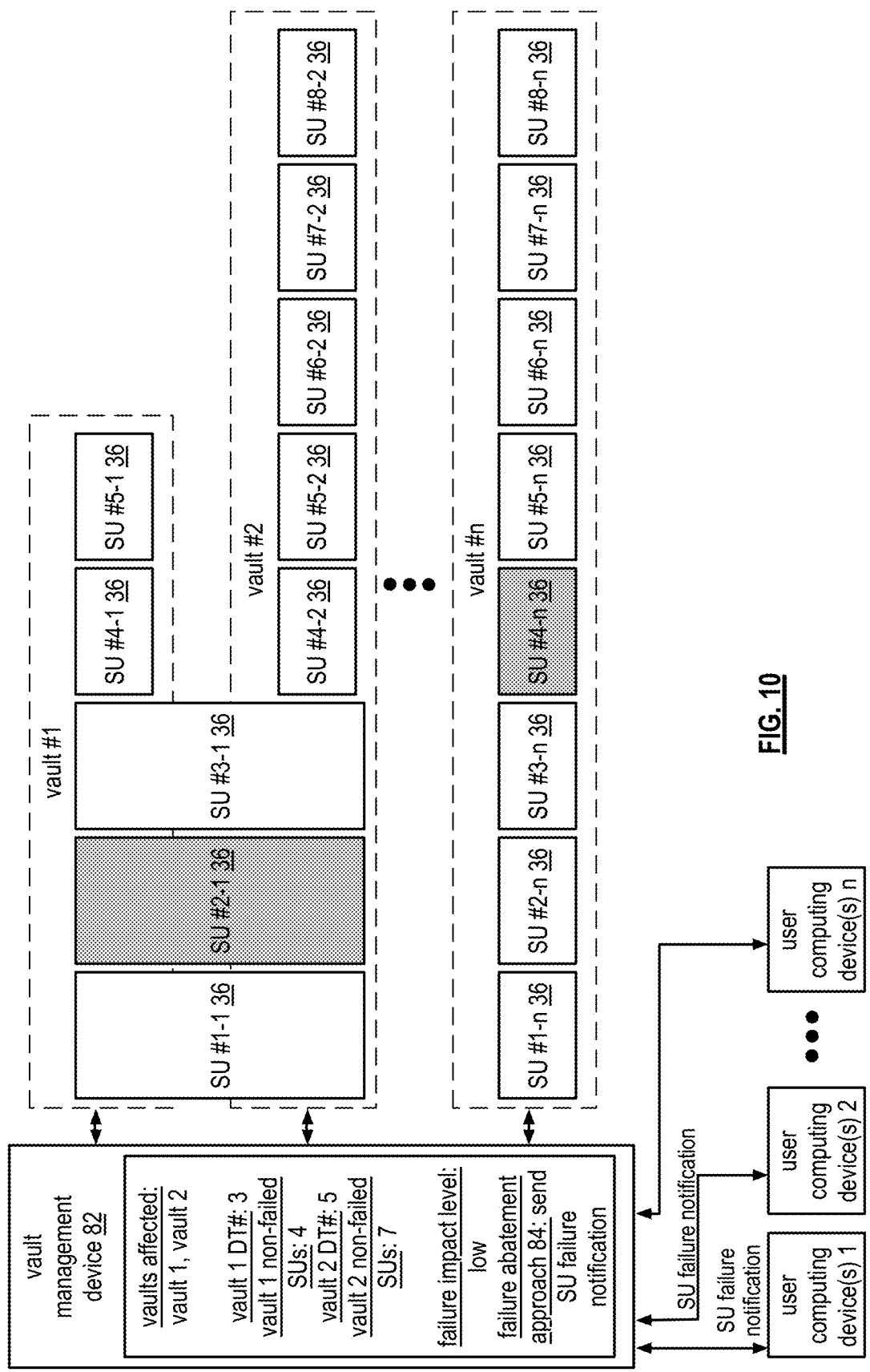
FIG. 10 is a schematic block diagram of another embodiment of multiple vault management in accordance with the present invention.

FIG. 10 is a schematic block diagram of another embodiment of multiple vault management that includes the vault management device 82, the plurality of vaults 1-n, and the plurality of user computing device(s) 1-n. Here, the vault management device 82 detects failed storage units SU #2-1 36 and SU #4-n 36 (as shown in gray). The detecting includes one or more of receiving an error message (e.g., from one or more of the storage unit and the user computing device), performing a storage unit failure query, performing a test, and detecting one or more data slice errors associated with the failed storage unit. The vault management device 82 identifies one or more vaults associated with the detected failed storage units. The identifying includes at least one of receiving a message from the failed storage unit and/or a computing device associated with the failed storage unit, performing a lookup (e.g., a registry lookup), and performing a vault association query (requesting vault association information from the failed storage unit and/or a computing device associated with the failed storage unit).

The vault management device 82 detects that failed storage unit SU #2-1 36 is common to vaults #1 and #2, whereas, failed storage unit SU #4-n is associated with vault #n. Because failed storage unit SU #4-n 36 is only common to vault #n, its failure is dealt with according to standard procedures (e.g., remedied at the vault or storage unit level). However, because failed storage unit SU #2-1 36 is common to two or more vaults (vaults #1 and #2) and poses a greater system impact, the vault management device 82 takes further steps to assess the effect of the storage unit failure on the system and develop a failure abatement approach 84.

The vault management device 82 identifies a number of non-failed storage units of the storage units associated with vaults #1 and #2. For example, the vault management device 82 queries the storage units of vaults #1 and #2 to determine that vault #1 includes non-failed storage units SU #1-1, SU #3-1, SU #4-1 and SU #5-1 and vault #2 includes non-failed storage units SU #1-1, SU #3-1, SU #4-2, SU #5-2, SU #6-2, SU #7-2, and SU #8-2.

The vault management device 82 compares the number of non-failed storage units with first and second decode threshold numbers to determine a failure impact level. For example, vault #1 includes five storage units, four non-failed storage units, and has a first decode threshold (DT) number of three. Vault #2 includes eight storage units, seven non-failed storage units, and has a second decode threshold (DT) number of five. The first and second decode threshold numbers refer to the number of storage units required to recover the data (e.g., data that has been dispersed error encoded and stored across multiple storage units). The vault management device 82 assesses whether the number of non-failed storage units compare favorably to the first and second decode threshold numbers. For example, the vault management device 82 may determine that the number of non-failed storage units compares favorably to the first and second decode threshold numbers when equal to or higher than a decode threshold plus one. Alternatively, the vault management device 82 may determine that the number of non-failed storage units compares favorably to the first and second decode threshold numbers when equal to or higher than a decode threshold number. Because the number of non-failed storage units of both vault #1 and vault #2 are higher than or equal to the first and second decode threshold numbers plus one, the vault management device 82 determines the failure impact level as low.

The vault management device 82 also factors in the number of vaults affected by the failed storage unit. Here, while the failure impact level is low, if more vaults were affected, the failure impact level may increase even if the number of non-failed storage units compare favorably the respective vault's decode threshold numbers. A greater number of vaults affected would increase the need for a more aggressive failure abatement approach 84, whereas, a lower number of vaults affected would decrease the need for a more aggressive failure abatement approach 84.

The vault management device 82 determines a failure abatement approach 84 based on the failure impact level. Because the failure impact level is low, the vault management device 82 determines to implement the least aggressive failure abatement approach 84 of sending a failed storage unit notification to one or more user computing devices associated with the first and second vaults. The vault management device 82 facilitates the failure abatement approach 84 by sending the failed storage unit notifications to user computing device(s) 1 and user computing device(s) 2. The failed storage unit notifications may include a request to replace the failed storage units or otherwise remedy the failure (e.g., a request to initiate rebuilding).

Figure 11:
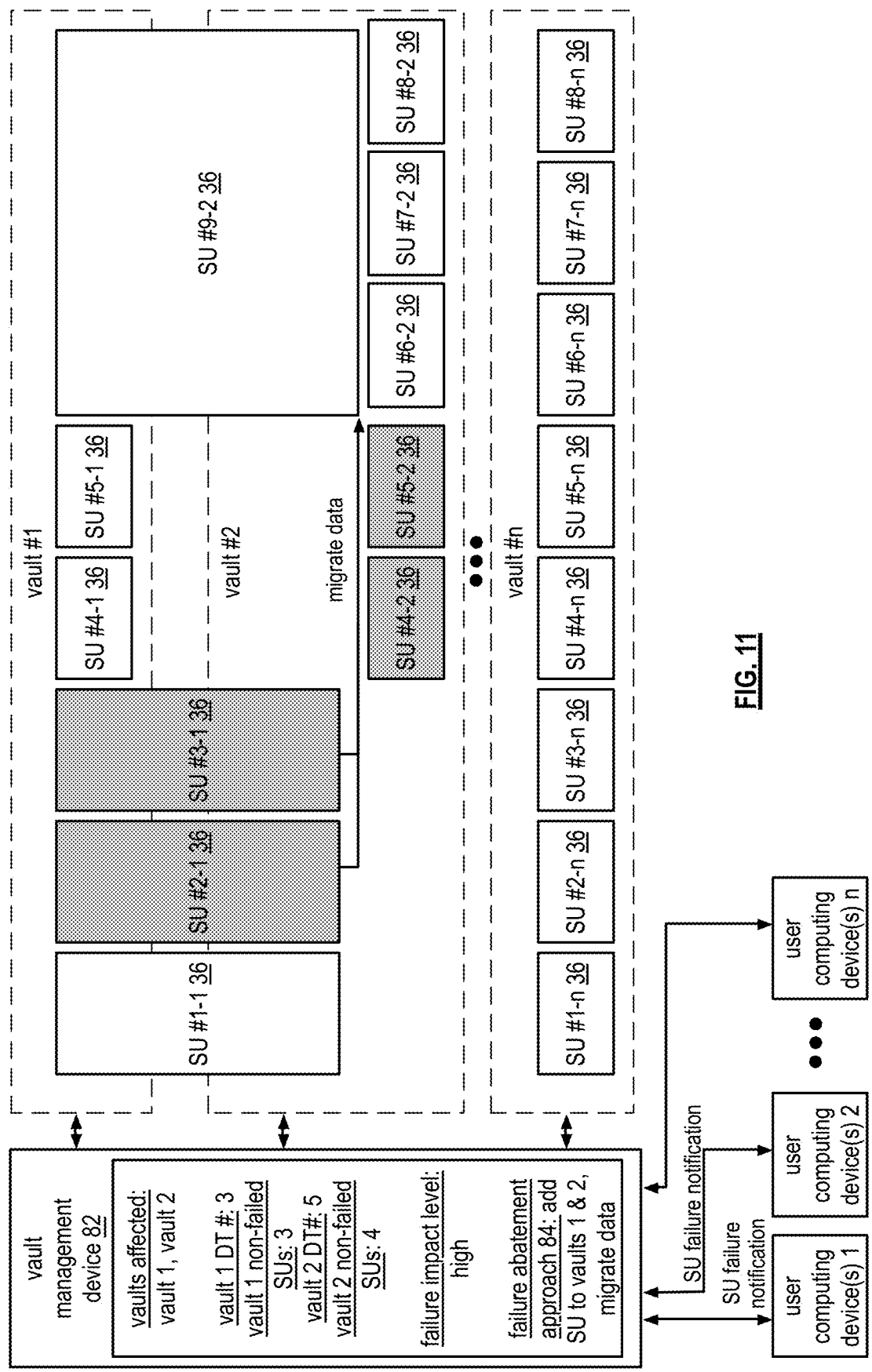
FIG. 11 is a schematic block diagram of another embodiment of multiple vault management in accordance with the present invention.

FIG. 11 is a schematic block diagram of another embodiment of multiple vault management that includes the vault management device 82, the plurality of vaults 1-n, and the plurality of user computing device(s) 1-n. Here, the vault management device 82 detects failed storage units SU #2-1 36, SU #3-1 36, SU #4-2 36, and SU #5-2 36 (as shown in gray).

The vault management device 82 detects that failed storage units SU #2-1 36 and SU #3-1 36 are common to vaults #1 and #2. The vault management device 82 further identifies a number of non-failed storage units of the storage units associated with vaults #1 and #2. Vault #1 includes non-failed storage units SU #1-1, SU #4-1 and SU #5-1 and vault #2 includes non-failed storage units SU #1-1, SU #6-2, SU #7-2, and SU #8-2.

The vault management device 82 compares the number of non-failed storage units with first and second decode threshold numbers to determine a failure impact level. Vault #1 includes five storage units, three non-failed storage units, and has a first decode threshold (DT) number of three. Vault #2 includes eight storage units, four non-failed storage units, and has a second decode threshold (DT) number of five.

The first and second decode threshold numbers refer to the number of storage units required to recover the data (e.g., data that has been dispersed error encoded and stored across multiple storage units). The vault management device 82 assesses whether the number of non-failed storage units compare favorably to the first and second decode threshold numbers. For example, the vault management device 82 may determine that the number of non-failed storage units compares favorably to the first and second decode threshold numbers when equal to or higher than a decode threshold plus one. Alternatively, the vault management device 82 may determine that the number of non-failed storage units compares favorably to the first and second decode threshold numbers when equal to or higher than a decode threshold number.

While the number of non-failed storage units of vault #1 is higher than or equal to the first decode threshold number plus one, the number of non-failed storage units of vault #2 is lower than the second decode threshold number. Therefore, the failure impact level is high with respect to vault #2. The vault management device 82 also factors in the number of vaults affected by the failed storage unit. Since two vaults are affected, and one is critically affected, the overall failure impact is high.

The vault management device 82 determines a failure abatement approach 84 based on the failure impact level. Because the failure impact level is high, the vault management device 82 determines an aggressive failure abatement approach 84 that includes sending a failed storage unit notification to one or more user computing devices associated with the first and second vaults and activating at least one replacement storage for storing data associated with the failed storage units as the failure abatement approach 84. The failed storage unit notifications may include a request to replace the failed storage units or otherwise remedy the failure (e.g., a request to initiate rebuilding). The vault management device 82 then facilitates the failure abatement approach 84 by sending the failed storage unit notifications to user computing device(s) 1 and user computing device(s) 2 and activating a replacement storage unit SU #9-2 36 associated with vaults #1 and #2.

Activating the at least one replacement storage unit for storing the data associated with the one or more failed storage units includes rebuilding the data associated with the failed storage unit to the replacement storage unit or migrating the data associated with the failed storage unit to the replacement storage unit for at least temporary storage. Here, the data associated with the failed storage units SU #2-1 36 and SU #3-1 36 is migrated to the replacement storage unit SU #9-2 36 (temporarily, permanently, for a predetermined amount of time, etc.).

Figure 12:
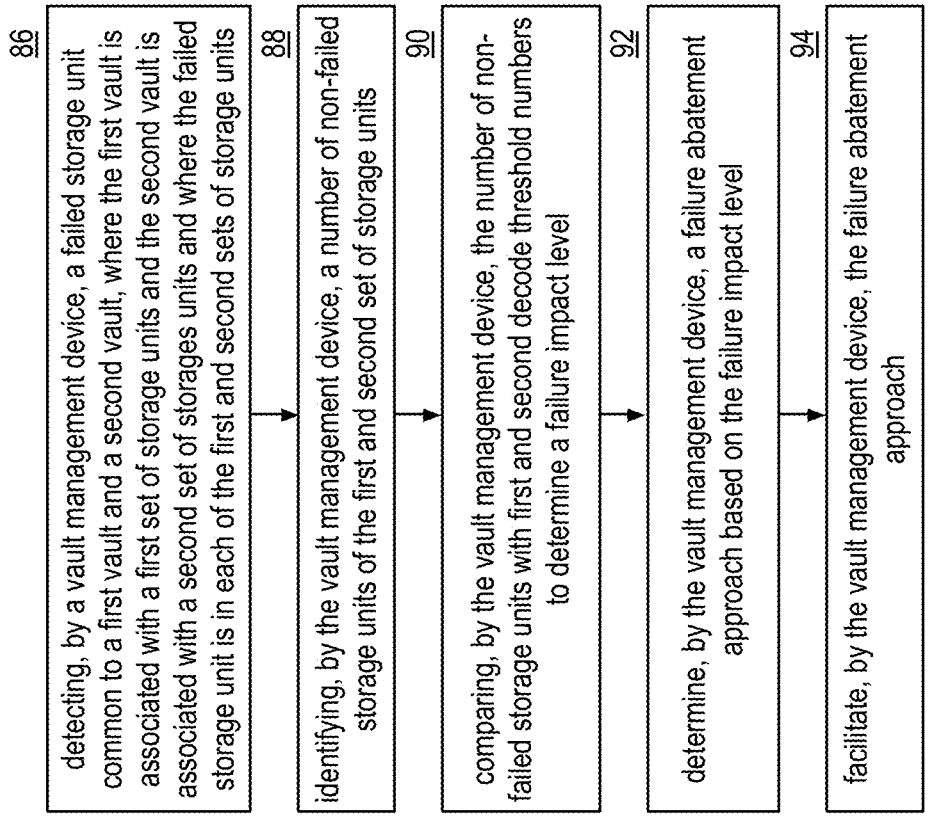
FIG. 12 is a logic diagram of an example of a method of a failure abatement approach for failed storage units common to multiple vaults in accordance with the present invention.

FIG. 12 is a logic diagram of an example of a method of a failure abatement approach for failed storage units common to multiple vaults. The method begins with step 86 where a vault management device detects a failed storage unit common to a first vault and a second vault. The first vault is associated with a first set of storage units and the second vault is associated with a second set of storage units. The failed storage unit is in each of the first and second sets of storage units. The storage units of the first set of storage units may be the same storage units as the storage units of the second set of storage units. Alternatively, the first set of storage units may include at least one storage unit not in common with the second set of storage units.

The detecting the failed storage unit includes one or more of: receiving an error message (e.g., from one or more of the storage unit and the user computing device), performing a storage unit failure query, performing a test, and detecting one or more data slice errors associated with the failed storage unit. When a failed storage unit is detected, the vault management device identifies vaults associated with the failed storage unit. For example, the vault management device identifies the first vault and the second vault as associated with the failed storage unit by one or more of: performing a lookup (e.g., a registry lookup) and performing a vault association query (requesting vault association information from the failed storage unit and/or a computing device associated with the failed storage unit).

The method continues with step 88 where the vault management device identifies a number of non-failed storage units of the first and second set of storage units. The method continues with step 90 where the vault management device compares the number of non-failed storage units with first and second decode threshold numbers to determine a failure impact level. The first decode threshold number is associated with the first vault and the second decode threshold number is associated with the second vault. The first and second decode threshold numbers refer to the number of storage units required to recover the data (e.g., data that has been dispersed error encoded and stored across multiple storage units).

The vault management device determines the failure impact level by comparing a first number of non-failed storage units of the number of non-failed storages units of the first set of storage units with. For example, the vault management device may determine that the first number of non-failed storage units compares favorably to the first decode threshold number when equal to or higher than a first decode threshold plus one. Alternatively, the vault management device may determine that the first number of non-failed storage units compares favorably to the first decode threshold number when equal to or higher than the first decode threshold number.

The vault management device compares a second number of non-failed storage units of the number of non-failed storages units of the second set of storage units with the second decode threshold number to determine a second failure impact level of the second vault. For example, the vault management device may determine that the second number of non-failed storage units compares favorably to the second decode threshold number when equal to or higher than a second decode threshold plus one. Alternatively, the vault management device may determine that the second number of non-failed storage units compares favorably to the second decode threshold number when equal to or higher than the second decode threshold number.

The vault management device compares the first failure impact level and the second failure impact level to determine the failure impact level. For example, a first failure impact level of low (e.g., the first number of non-failed storage units compared favorably to the first decode threshold number) and a second failure impact level of high (e.g., the second number of non-failed storage units compared unfavorably to the second decode threshold number) may result in a moderate to high failure impact level. The vault management device also factors in the number of vaults affected by the failed storage unit. For example, if more than two vaults were affected, the failure impact level may increase even if the number of non-failed storage units compare favorably the respective vault's decode threshold numbers.

The method continues with step 92 where the vault management device determines a failure abatement approach based on the failure impact level. Determining the failure abatement approach includes one or more of: determining to send a failed storage unit notification to one or more computing devices associated with the first and second vaults; and determining to activate at least one replacement storage unit for storing data associated with the failed storage unit. The failed storage unit notification may include a request to replace and/or repair the failed storage unit.

The method continues with step 94 where the vault management device facilitates the failure abatement approach. The facilitating the failure abatement approach includes one or more of: sending the failed storage unit notification to the one or more computing devices associated with the first and second vaults; and activating the at least one replacement storage unit for storing the data associated with the failed storage unit. Activating the at least one replacement storage unit for storing the data associated with the failed storage unit includes rebuilding the data associated with the failed storage unit to the replacement storage unit, or migrating the data associated with the failed storage unit to the replacement storage unit for at least temporary storage.

As another example, the vault management device detects a second failed storage unit common to the first vault, the second vault, and a third vault. The third vault is associated with a third set of storage units, and the second failed storage unit is in each of the first, second, and third sets of storage units. identifying, by the vault management device, a second number of non-failed storage units of the first, second, and third set of storage units. The vault management device compares the second number of non-failed storage units with the first decode threshold number, the second decode threshold number, and a third decode threshold number to determine a second failure impact level. The third decode threshold number is associated with the third vault. The vault management device determines a second failure abatement approach based on the second failure impact level and facilitates the second failure abatement approach.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a vault management device of a storage network, the method comprising:
    determining a failure impact level for vaults of the storage network based on a failed storage unit within the vaults, wherein the vaults include a first vault that is associated with a first set of storage units and a first decode threshold number, and a second vault that is associated with a second set of storage units and a second decode threshold number, and wherein the failure impact level is based on a number of non-failed storage units within each of the vaults;
    determining a failure abatement approach based on the failure impact level; and
    facilitating the failure abatement approach.

2. The method of claim 1 further comprises:
    detecting the failed storage unit by receiving an error message from the failed storage unit.

3. The method of claim 1 further comprises:
    detecting the failed storage unit by receiving an error message from a user computing device of the storage network.

4. The method of claim 1 further comprises:
    detecting the failed storage unit by performing a storage unit failure query.

5. The method of claim 1 further comprises:
    detecting the failed storage unit by performing a test.

6. The method of claim 1 further comprises:
    detecting the failed storage unit by detecting a data slice error associated with the failed storage unit.

7. The method of claim 1 further comprises:
    identifying the first vault and the second vault as associated with the failed storage unit by performing a vault association query.

8. The method of claim 1, wherein the determining the failure impact level further comprises:
    comparing a first number of non-failed storage units of the first set of storage units with the first decode threshold number to determine a first failure impact level of the first vault;
    comparing a second number of non-failed storage units of the second set of storage units with the second decode threshold number to determine a second failure impact level of the second vault; and
    comparing the first failure impact level and the second failure impact level to determine the failure impact level.

9. The method of claim 1, wherein the first set of storage units is in common with the second set of storage units.

10. The method of claim 1, wherein the first set of storage units includes at least one storage unit not in common with the second set of storage units.

11. The method of claim 1, wherein the determining the failure abatement approach comprises:
    determining to send a failed storage unit notification to one or more computing devices associated with the first and second vaults.

12. The method of claim 11, wherein the determining the failure abatement approach comprises:
    determining to activate at least one replacement storage unit for storing data associated with the failed storage unit.

13. The method of claim 12, wherein the facilitating the failure abatement approach comprises:
    sending the failed storage unit notification to the one or more computing devices associated with the first and second vaults.

14. The method of claim 12, wherein the facilitating the failure abatement approach comprises:
    activating the at least one replacement storage unit for storing the data associated with the failed storage unit, wherein the activating includes:
        rebuilding the data associated with the failed storage unit to the replacement storage unit.

15. The method of claim 12, wherein the facilitating the failure abatement approach comprises:
    activating the at least one replacement storage unit for storing the data associated with the failed storage unit, wherein the activating includes:
        migrating, by the vault management device, the data associated with the failed storage unit to the replacement storage unit.

16. The method of claim 1 further comprises:
    detecting a second failed storage unit that is common to the first vault, the second vault, and a third vault, wherein the third vault is associated with a third set of storage units and a third decode threshold number, wherein the second failed storage unit is in each of the first, second, and third sets of storage units;
    identifying a second number of non-failed storage units of the first, second, and third sets of storage units;
    comparing the second number of non-failed storage units with the first decode threshold number, the second decode threshold number, and the third decode threshold number to determine a second failure impact level;
    determining a second failure abatement approach based on the second failure impact level; and
    facilitating the second failure abatement approach.

17. The method of claim 1 further comprises:
    detecting the failed storage unit is common to the first vault and the second vault; and
    comparing the number of non-failed storage units with the first and second decode threshold numbers to determine the failure impact level is of a first level based on the commonality of the first and second vaults.

18. The method of claim 17 further comprises:
    determining the failed storage unit is common to the first vault, the second vault and a third vault of the vaults; and
    determining the failure impact level is of a second level based on the commonality of the first, second and third vaults, wherein the second level is greater than the first.

19. The method of claim 1, wherein the failure impact level is further based on the first decode threshold number.

20. The method of claim 19, wherein the failure impact level is further based on the second decode threshold number.

* * * * *